US011961758B2

(12) United States Patent
Shindo

(10) Patent No.: US 11,961,758 B2
(45) Date of Patent: Apr. 16, 2024

(54) APPARATUS FOR PROCESSING SUBSTRATE AND METHOD OF TRANSFERRING SUBSTRATE

(71) Applicant: Tokyo Electron Limited, Tokyo (JP)

(72) Inventor: Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 17/653,889

(22) Filed: Mar. 8, 2022

(65) Prior Publication Data

US 2022/0301921 A1 Sep. 22, 2022

(30) Foreign Application Priority Data

Mar. 16, 2021 (JP) ................................ 2021-042787

(51) Int. Cl.

*H01L 21/67* (2006.01)
*H01L 21/677* (2006.01)
*H01L 21/687* (2006.01)
*H02N 15/00* (2006.01)

(52) U.S. Cl.

CPC .. *H01L 21/68764* (2013.01); *H01L 21/67167* (2013.01); *H01L 21/67748* (2013.01); *H01L 21/68707* (2013.01); *H02N 15/00* (2013.01)

(58) Field of Classification Search

None

See application file for complete search history.

(56) References Cited

U.S. PATENT DOCUMENTS 7,988,398 B2 * 8/2011 Hofmeister ....... H01L 21/67727 156/345.31
8,851,817 B2 * 10/2014 Bonora ............. H01L 21/67766 414/217
2018/0308735 A1 * 10/2018 Janakiraman ........ H02K 41/031

FOREIGN PATENT DOCUMENTS

JP 2020-500255 A 1/2020

* cited by examiner

*Primary Examiner* — Michael S Lowe
(74) *Attorney, Agent, or Firm* — Armstrong Teasdale LLP

(57) ABSTRACT

An apparatus for transferring a substrate to a substrate processing chamber includes: a substrate transfer chamber including a floor surface portion having a traveling surface-side magnet provided therein and a sidewall portion having an opening for transferring the substrate therethrough; a substrate transfer module including a substrate holder and a floating body-side magnet acting a repulsive force with the traveling surface-side magnet, and configured to be movable on a traveling surface formed in a region provided with the traveling surface-side magnet by magnetic floating using the repulsive force; the substrate processing chamber connected to the substrate transfer chamber via a gate valve constituting a non-traveling region in which the substrate transfer module is not movable by the magnetic floating; and a transfer assist mechanism for assisting the transfer of the substrate by the substrate transfer module between the substrate transfer chamber and the substrate processing chamber via the non-traveling region.

11 Claims, 15 Drawing Sheets

APPARATUS FOR PROCESSING SUBSTRATE AND METHOD OF TRANSFERRING SUBSTRATE

CROSS-REFERENCE TO RELATED APPLICATION

This application is based upon and claims the benefit of priority from Japanese Patent Application No. 2021-042787, filed on Mar. 16, 2021, the entire contents of which are incorporated herein by reference.

TECHNICAL FIELD

The present disclosure relates to an apparatus for processing a substrate and a method of transferring the substrate.

BACKGROUND

For example, in an apparatus that performs processing on a semiconductor wafer (hereinafter, also referred to as a "wafer") as a substrate, the transfer of the wafer is performed between a carrier that accommodates the wafer and a wafer processing chamber in which the processing is executed. When transferring the wafer, wafer transfer mechanisms having various configurations are used.

For example, Patent Document 1 discloses a guide structure for transferring a carrier in a transfer direction in a non-contact manner by floating a carrier using a magnetic force.

PRIOR ART DOCUMENT

Patent Document

Patent Document 1: Japanese Laid-Open Patent Publication No. 2020-500255

SUMMARY

According to one embodiment of the present disclosure, there is provided an apparatus for transferring a substrate to at least one substrate processing chamber to process the substrate, including: a substrate transfer chamber including a floor surface portion in which a traveling surface-side magnet is provided and a sidewall portion in which a plurality of openings for loading/unloading the substrate between the substrate transfer chamber and the at least one substrate processing chamber is formed; a substrate transfer module including a substrate holder configured to hold the substrate and a floating body-side magnet that acts a repulsive force with the traveling surface-side magnet, the substrate transfer module being configured to be movable on a first traveling surface formed in a region provided with the traveling surface-side magnet by a magnetic floating using the repulsive force; the at least one substrate processing chamber connected to the substrate transfer chamber via a gate valve configured to open/close each of the plurality of openings and constituting a non-traveling region in which the substrate transfer module is not movable by the magnetic floating; and a transfer assist mechanism configured to assist the transfer of the substrate by the substrate transfer module between the substrate transfer chamber and a substrate processing position inside the at least one substrate processing chamber via the non-traveling region.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, the overall configuration of a wafer processing system 100, which is an "apparatus for processing a substrate" according to an embodiment of the present disclosure, will be described with reference to FIG. 1

Figure 1:
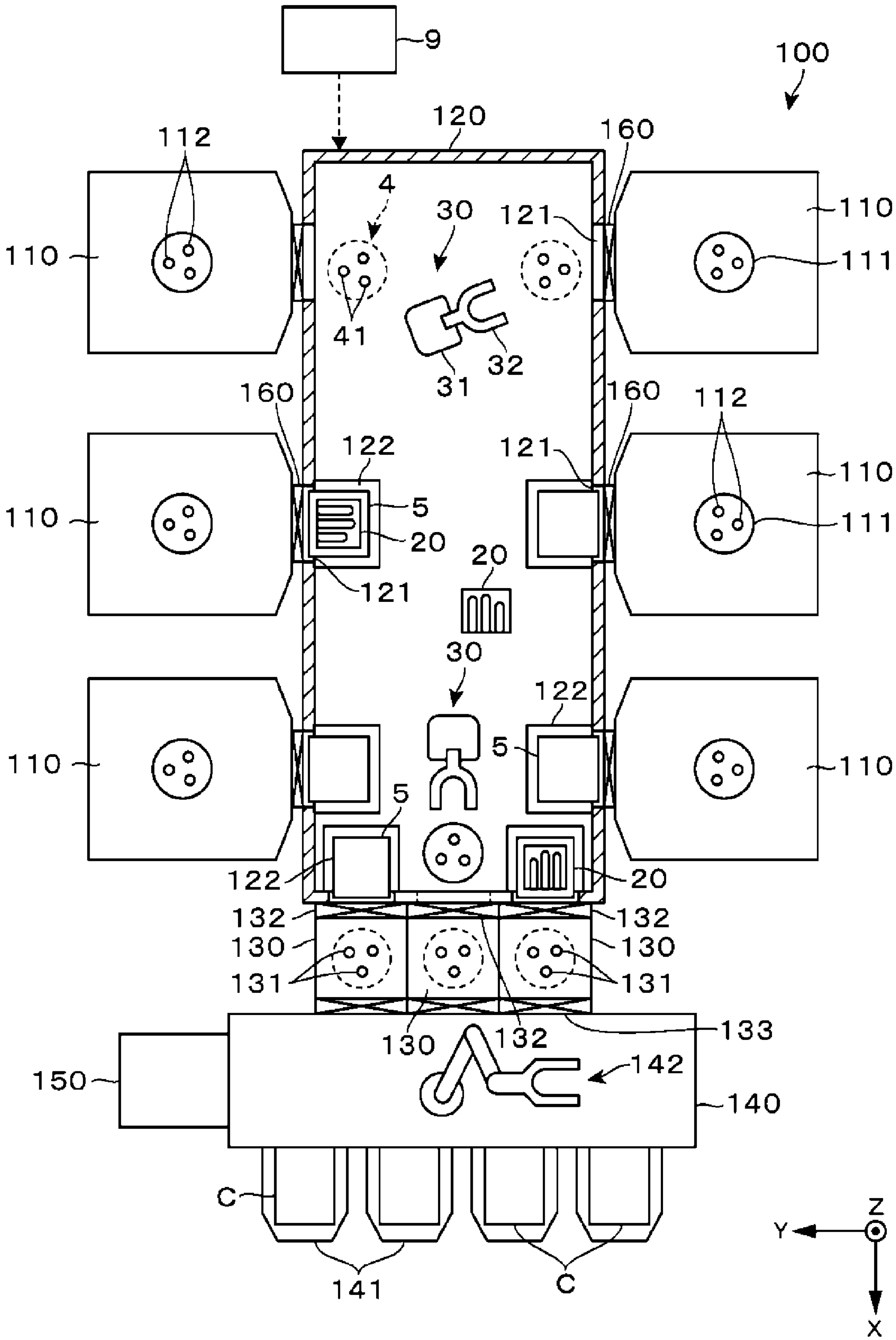
FIG. 1 is a plan view of a wafer processing system according to an embodiment.

FIG. 1 illustrates a multi-chamber type wafer processing system 100 including a plurality of wafer processing chambers 110, which are substrate processing chambers in each of which a wafer W is processed. As illustrated in FIG. 1, the wafer processing system 100 includes load ports 141, an atmospheric transfer chamber 140, load-lock chambers 130, a vacuum transfer chamber 120, and a plurality of wafer processing chambers 110. In the following description, a side at which the load ports 141 are provided is referred to as a front side.

In the wafer processing system 100, the load ports 141, the atmospheric transfer chamber 140, the load-lock chambers 130, and the vacuum transfer chamber 120 are arranged in this order in the horizontal direction from the front side. In addition, the plurality of wafer processing chambers 110 are provided side by side on the left and right sides of the vacuum transfer chamber 120 when viewed from the front side.

Each load port 141 is configured as a stage on which a carrier C accommodating the wafer W to be processed is placed. Four load ports 141 are provided side by side in the left-right direction when viewed from the front side. As the carrier C, for example, a front opening unified pod (FOUP) may be used.

The atmospheric transfer chamber 140 has an atmospheric pressure (normal pressure) atmosphere. Thus, for example, a down-flow of clean air is formed in the atmospheric transfer chamber 140. A wafer transfer mechanism 142 is provided inside the atmospheric transfer chamber 140 to transfer the wafer W. The wafer transfer mechanism 142 inside the atmospheric transfer chamber 140 transfers the wafer W between the carrier C and the load-lock chamber 130. In addition, for example, an alignment chamber 150 configured to align the wafer W is provided on, for example, the left side surface of the atmospheric transfer chamber 140.

Three load-lock chambers 130 are provided side by side between the vacuum transfer chamber 120 and the atmospheric transfer chamber 140. Each of the load-lock chambers 130 has lifting pins 131 that push up and hold the wafer W loaded into the load-lock chamber 130 from below. Three lifting pins 131 are provided at equal intervals in the circumferential direction and are configured to be movable up and down. Each load-lock chamber 130 is configured such that the interior thereof can be switched between an atmospheric pressure atmosphere and a vacuum atmosphere.

The load-lock chambers 130 and the atmospheric transfer chamber 140 are connected via respective gate valves 133. The load-lock chambers 130 and the vacuum transfer chamber 120 are connected via respective gate valves 132.

The vacuum transfer chamber 120 is depressurized to a vacuum atmosphere by a vacuum exhaust mechanism (not illustrated). The vacuum transfer chamber 120 corresponds to a substrate transfer chamber of the present embodiment. In the example illustrated in FIG. 1, the vacuum transfer chamber 120 in which the wafer W is transferred in a vacuum atmosphere is configured with a rectangular housing that is long in the front-rear direction in a plan view. In the wafer processing system 100 of this example, on each of left and right sidewalls of the vacuum transfer chamber 120, three wafer processing chambers 110 (a total of six wafer processing chambers 110) are provided. When the interior of the vacuum transfer chamber 120 illustrated in FIG. 1 is divided into three regions of a front stage, a middle stage, and a rear stage from the front side, the wafer processing chambers 110 are provided to face each other with each region sandwiched between the left and right sides.

On the sidewalls of the vacuum transfer chamber 120 to which the wafer processing chambers 110 are connected, openings 121 through each of which the wafer W is loaded into and unloaded from the respective wafer processing chambers 110 are provided.

Each wafer processing chamber 110 is connected to the vacuum transfer chamber 120 via a gate valve 160 that opens and closes the respective opening 121 described above. In each wafer processing chamber 110, the wafer W is placed on a stage 111 provided inside the wafer processing chamber 110 in a state in which the wafer processing chamber 110 is depressurized to a vacuum atmosphere by a vacuum exhaust mechanism (not illustrated), and predetermined processing is performed on the wafer W. A placement region of the wafer W on the stage 111 corresponds to a processing position of the wafer W. Each wafer processing chamber 110 includes lifting pins 112 that push up the wafer W loaded into the wafer processing chamber 110 from below to hold the wafer W. Three lifting pins 112 are provided at equal intervals in the circumferential direction and are configured to be movable up and down.

Examples of the processing to be performed on the wafer W may include an etching process, a film forming process, a cleaning process, an ashing process, and the like.

The stage 111 is provided with, for example, a heater (not illustrated) that heats the wafer W to a predetermined temperature. In a case in which the processing performed on the wafer W uses a processing gas, the wafer processing chamber 110 is provided with a processing gas supplier (not illustrated) configured with a shower head or the like. In addition, the wafer processing chamber 110 may be provided with a plasma forming mechanism configured to plasmarize the processing gas.

A first transfer module 20 configured in a square plate shape and a second transfer module 30 provided with an arm 32 including a fork-shaped substrate holder are accommodated in the vacuum transfer chamber 120. Each of the first transfer module 20 and the second transfer module 30 is configured to be movable inside the vacuum transfer chamber 120 by magnetic floating. The first transfer module 20 and the second transfer module 30 correspond to a substrate transfer module of the present embodiment.

In the wafer processing system 100 of this example, the wafer W is transferred between the two load-lock chambers 130 on the left and right sides when viewed from the front side and the four wafer processing chambers 110 at the front stage side and the middle stage side using the first transfer module 20. In addition, the wafer W is transferred between one load-lock chamber 130 in the center when viewed from the front side and the two wafer processing chambers 110 at the rear stage side using the second transfer module 30.

The wafer processing system 100 includes a controller 9 configured to control a traveling surface-side coil 15 (to be described later), the wafer processing chamber 110, and the like. The controller 9 is configured with a computer including a CPU and a storage part, and controls each part of the wafer processing system 100. A program incorporating a group of steps (instructions) for controlling the operations and the like of the first and second transfer modules 20 and 30, the wafer processing chambers 110 is recorded in the storage part. The program is stored in a non-transitory computer readable storage medium such as a hard disk, a compact disk, a magnetic optical disk, or a memory card, and is installed from the storage medium on the computer.

Hereinafter, with reference to FIGS. 2 to 5, the configurations of parts related to the transfer and processing of the wafer W using the first transfer module 20 will be described in detail.

Figure 2:
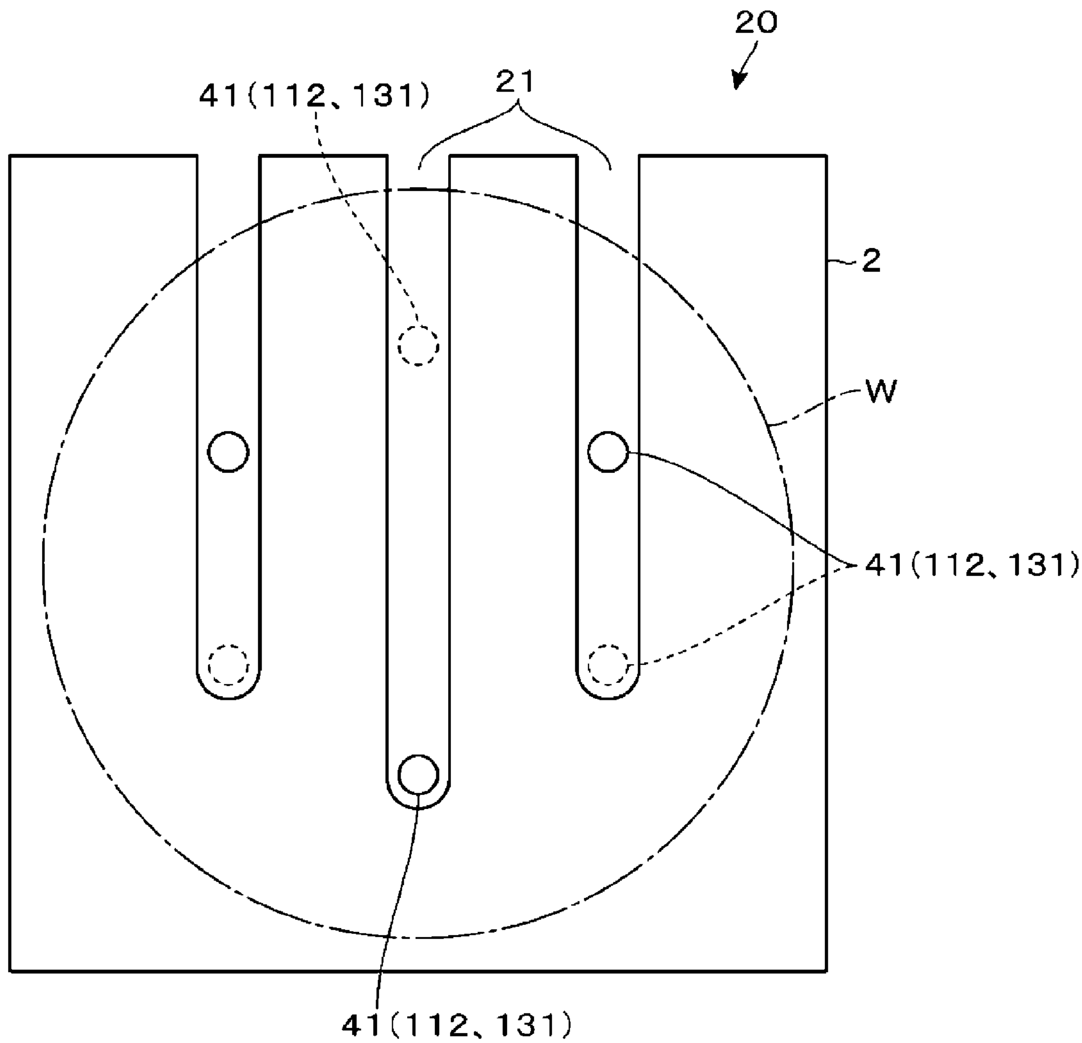
FIG. 2 is a plan view of a first transfer module.
Figure 3:
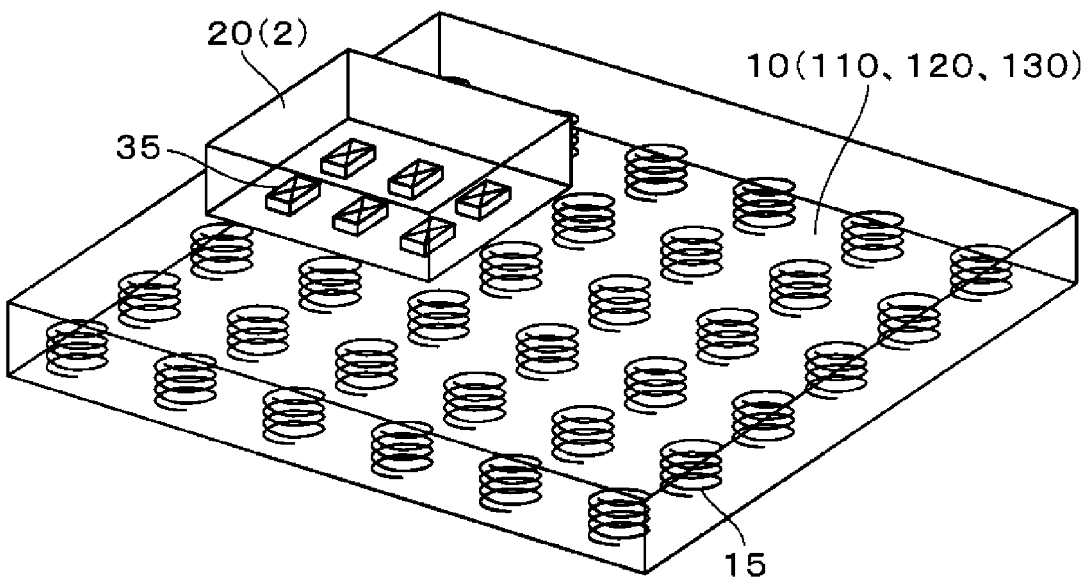
FIG. 3 is a transparent perspective view of the first transfer module and a floor surface portion.

As illustrated in FIGS. 2 and 3, the first transfer module 20 includes a stage 2 which is a substrate holder on which the wafer W having a diameter of 300 mm is placed and held. For example, the stage 2 is formed in a flat square plate shape having a side of about 300 mm.

The first transfer module 20 enters the wafer processing chamber 110 or the load-lock chamber 130, and performs delivery of the wafer W to and from the lifting pins 112 (or 131). The first transfer module 20 includes slits 21 to perform the delivery of the wafer W while avoiding interference with the lifting pins 112 (or 131). The lifting pins 112 (or 131) hold the wafer W in the state of protruding from the floor surface portion of the wafer processing chamber 110 or the load-lock chamber 130. The slits 21 are formed along trajectories through which the lifting pins 112 (or 131) pass when causing the stage 2 to enter and retract from below the wafer W held by the lifting pins 112 (or 131). In addition, the slits 21 are formed such that the direction in which the wafer W enters below the wafer W can be reversed by 180 degrees. With the above-described configuration, the first transfer module 20 and the lifting pins 112 (or 131) do not interfere with each other, and the centers of the first transfer module 20 and the wafer W can be arranged vertically to be aligned with each other.

As schematically illustrated in FIG. 3, each of the floor surface portion 10 of the vacuum transfer chamber 120, and the floor surface portions 10 of the load-lock chamber 130 and the wafer processing chamber 110 to which the first transfer module 20 enters, includes a plurality of traveling surface-side coils 15 arranged therein. The traveling surface-side coils 15 generate magnetic fields by being supplied with electric power from a power supply (not illustrated). The traveling surface-side coils 15 correspond to traveling surface-side magnets of the present embodiment.

Meanwhile, for example, a plurality of module-side magnets 35 configured with permanent magnets are arranged inside the first transfer module 20. A repulsive force acts on the module-side magnets 35 with the magnetic fields generated by the traveling surface-side coils 15. By this action, the first transfer module 20 can be magnetically floated on a traveling surface, which is a region of the floor surface portion 10 in which the traveling surface-side coils 15 are provided. In addition, by adjusting strengths and positions of the magnetic fields generated by the traveling surface-side coils 15, it is possible to move the first transfer module 20 in a desired direction, to adjust a floating amount of the first transfer module 20, and to adjust an orientation of the first transfer module 20 on the traveling surface.

The module-side magnets 35 provided in the first transfer module 20 correspond to floating body-side magnets of the present embodiment. The plurality of module-side magnets 35 may be configured with coils that are supplied with power from a battery provided inside the first transfer module 20 to function as electromagnets, or may be configured with both permanent magnets and coils.

The first transfer module 20 having the above-described configuration enters the wafer processing chamber 110 or the load-lock chamber 130 as described above, and performs the delivery of the wafer W to and from the lifting pins 112 (or 131). Meanwhile, the gate valves 160 provided between the vacuum transfer chamber 120 and the wafer processing chambers 110 or the gate valves 132 provided between the vacuum transfer chamber 120 and the load-lock chamber 130 are not provided with the coils for magnetic floating of the first transfer module 20. Therefore, the regions where the gate valves 160 and 132 are provided may be non-traveling regions where the first transfer module 20 cannot move.

Therefore, the wafer processing system 100 of the present example is provided with a bridging module 5 configured to assist the transfer of the wafer W transferred by the first transfer module 20 through the non-traveling region. Hereinafter, with reference to FIGS. 4 and 5, the configuration of the bridging module 5 will be described by taking as an example a case in which the gate valve 160 is provided between the vacuum transfer chamber 120 and the wafer processing chamber 110 is in the non-traveling region.

In addition, in FIGS. 4 and 5 described below, sub-coordinates (X'-Y'-Z' coordinates) for explaining the arrangement relationship of parts provided in each wafer processing chamber 110 are also indicated. In the sub-coordinates, when viewed from the vacuum transfer chamber 120, a position facing the wafer processing chamber 110 is set as the front side, the Y' direction is set as a front-rear direction, and the X' direction is set as a left-right direction (which is the same in FIGS. 8A to 10C).

Figure 4:
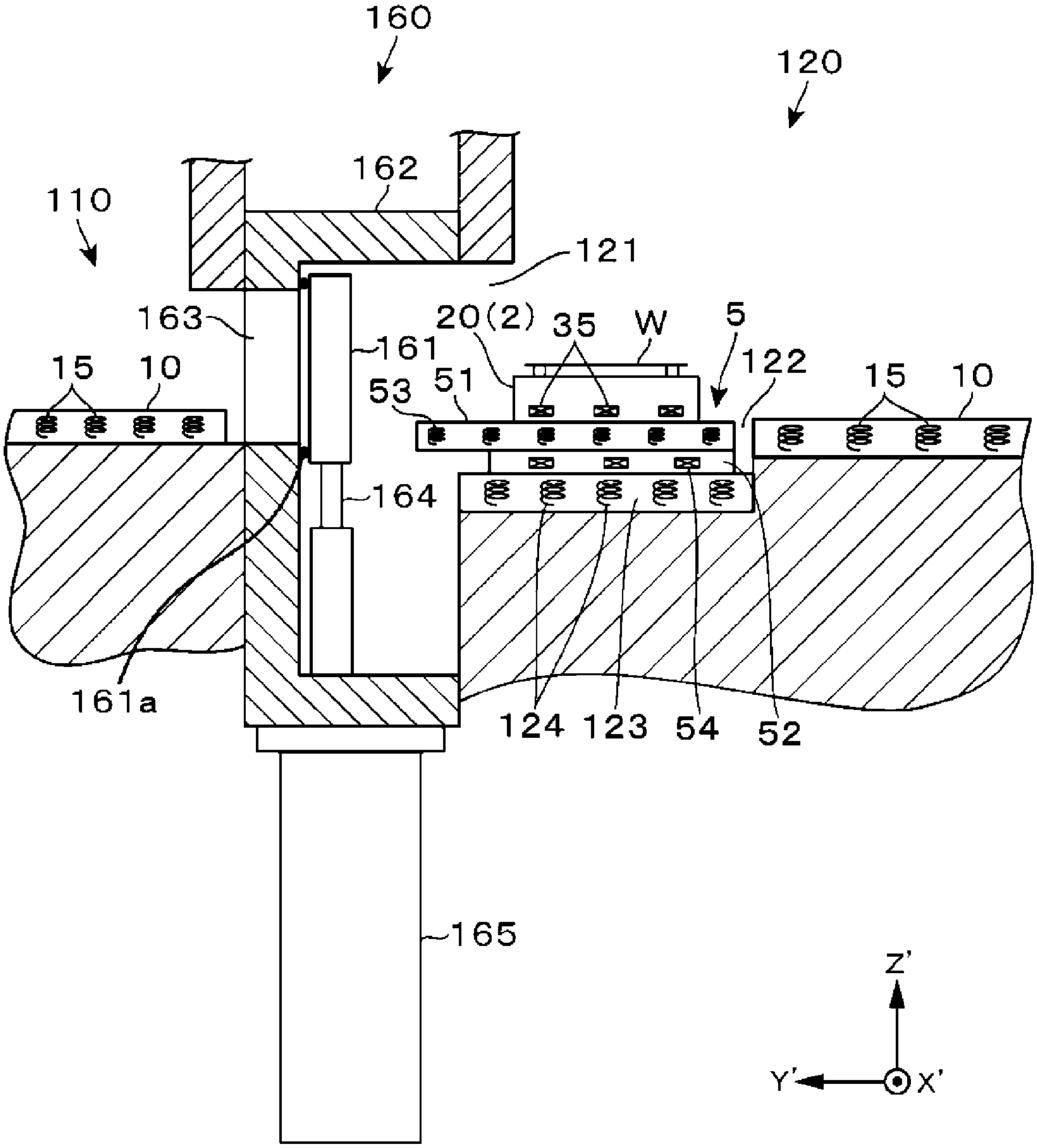
FIG. 4 is a first configuration view of a bridging module.
Figure 5:
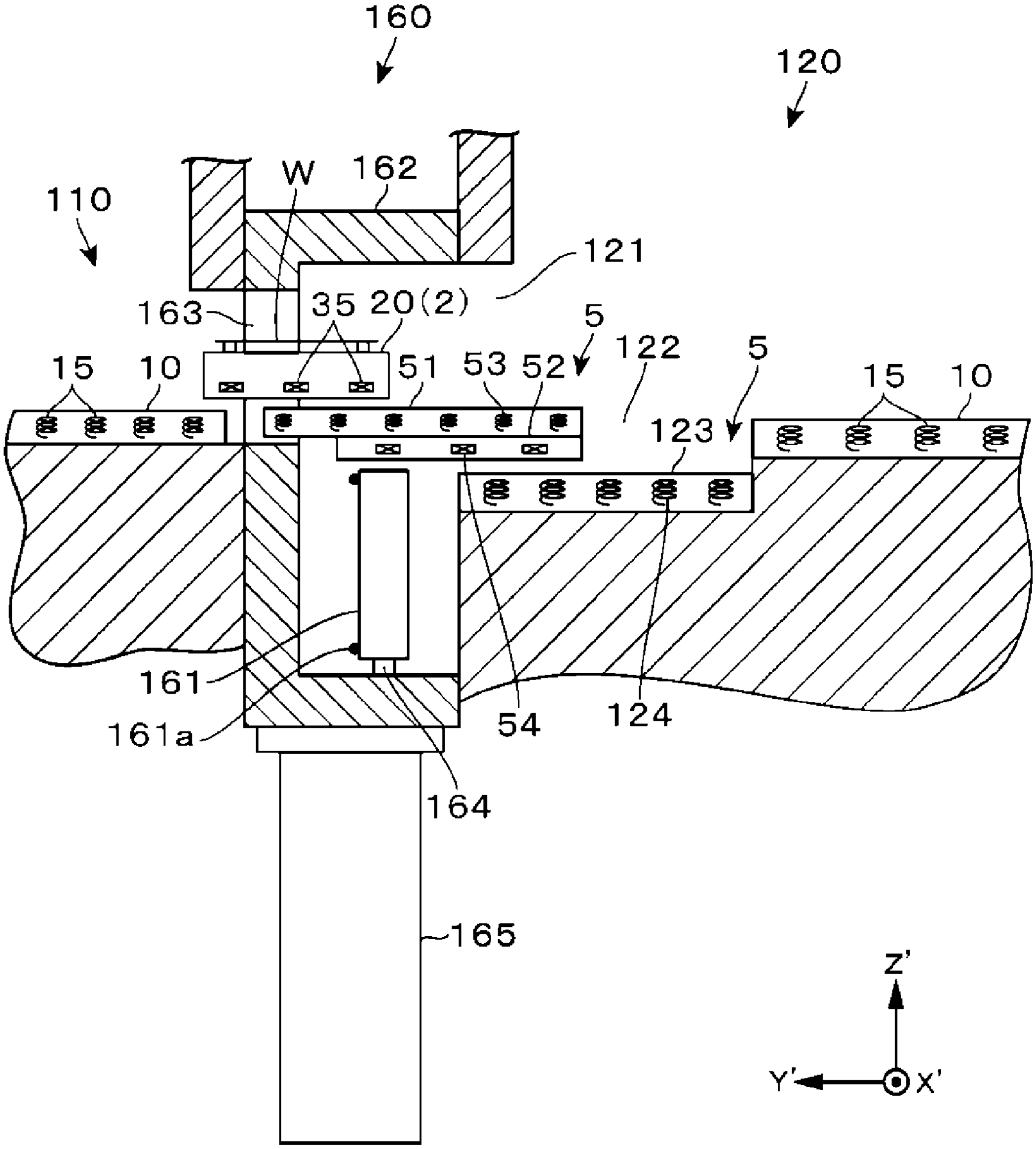
FIG. 5 is a second configuration view of the bridging module.

As illustrated in FIGS. 4 and 5, the gate valve 160 is provided with a valve box 162 disposed between the sidewall of the vacuum transfer chamber 120 and the sidewall of the wafer processing chamber 110, and including a loading/unloading port 163 formed to communicate with the opening 121 on the side of the vacuum transfer chamber 120, a valve body 161 configured to open/close the loading/unloading port 163, and a drive part 165 connected to the valve body 161 via a valve rod 164 to move the valve body 161.

The drive part 165 moves the valve body 161 in the vertical direction and the front-rear direction between a close position (FIG. 4) at which the loading/unloading port 163 is closed by the valve body 161 and an open position (FIG. 5) at which the valve body 161 is retracted downward inside the valve box 162 to open the loading/unloading port 163. In addition, a seal member 161*a* is provided in the side surface of the valve body 161. The seal member 161*a* is in close contact with the main body of the valve box 162 around the loading/unloading port 163 to hermetically close the loading/unloading port 163 when the valve body 161 is moved to the close position.

In the valve box 162 having the above-described configuration, it is impossible to dispose the traveling surface-side coils 15 because the interior of the valve box 162 is formed as a space in which the valve body 161 moves. It may be difficult for the first transfer module 20 to move beyond the non-traveling region having a dimension longer than half of the total length, for example, along the traveling direction thereof. Therefore, when the first transfer module 20 is moved between the vacuum transfer chamber 120 and the wafer processing chamber 110 without taking any measures, there is a possibility that the first transfer module 20 may fall into the valve box 162 or a region in which the loading/unloading port 163 is formed, and thus the floating state may not be recovered.

Therefore, as illustrated in FIGS. 1, 4, and 5, the vacuum transfer chamber 120 is provided with a bridging module 5 configured to assist the entry and retraction of the first transfer module 20 between the wafer processing chamber 110 and the load-lock chamber 130.

As illustrated in the vertical cross-sectional side views of FIGS. 4 and 5, the floor surface portion 10 of the vacuum transfer chamber 120 has a recess-shaped accommodation region 122 for accommodating the bridging module 5, which is formed in a region on the front side when viewed from the vacuum transfer chamber 120. A plurality of traveling surface-side coils 124 are arranged on the bottom surface portion 123 of the accommodation region 122, and generates magnetic fields by being supplied with power from a power supply (not illustrated). The traveling surface-side coils 124 correspond to traveling surface-side magnets for the bridging module 5 for forming the traveling surface of the bridging module 5 on the bottom surface portion 123.

The bridging module 5 is accommodated in the above-described accommodation region 122 and is disposed on the bottom surface portion 123. The bridging module 5 of the present example has a configuration in which two square plate-shaped base plates 52 and a bridging plate 51 are stacked in this order from the lower side.

Inside the base plate 52, for example, a plurality of module-side magnets 54 configured with permanent magnets are arranged. A repulsive force acts between the module-side magnets 54 and the magnetic fields generated by the traveling surface-side coils 124. With this action, it is possible to magnetically float the bridging module 5 on the traveling surface set in the region where the traveling surface-side coils 124 of the bottom surface portion 123 are provided, to move in a desired direction, or to perform the adjustment of the floating amount or the like.

The module-side magnets 54 provided on the base plate 52 correspond to floating body-side magnet for the bridging module of the present embodiment. The plurality of module-side magnets 54 may be configured with coils that are supplied with power from a battery provided inside the base plate 52 and function as electromagnets. Alternatively, the fact that permanent magnets and coils may be both provided to form the module-side magnet 54 is the same as in the case of the first transfer module 20.

A plurality of traveling surface-side coils 53 are arranged inside the bridging plate 51. The traveling surface-side coils 53 generate magnetic fields by being supplied with power from a power supply (not illustrated). A region in which the traveling surface-side coils 53 are provided also serves as the traveling surface for the first transfer module 20. Thus, it is possible to magnetically float the first transfer module 20 to move in a desired direction or to perform adjustment of the floating amount or the like. From this point of view, the traveling surface-side coils 53 correspond to the traveling surface-side magnets provided in the bridging module 5.

In addition, as illustrated in FIGS. 4 and 5, when viewed along the front-rear direction of the bridging module 5, a length dimension of the bridging plate 51 at the upper stage side is set to be larger than a length dimension of the base plate 52 at the lower stage side. In addition, the bridging module 5 is configured such that an end portion of the bridging plate 51 at the upper stage side protrudes toward the side at which the gate valve 160 is disposed.

The bridging module 5 having the above-described configuration is movable between an accommodation position illustrated in FIG. 4 and a bridging position illustrated in FIG. 5 in the state in which the first transfer module 20 is placed on the top surface of the bridging module 5. The accommodation position corresponds to a position where a traveling surface integrated with the floor surface portion 10 is formed in a state in which the bridging module 5 is accommodated in the accommodation region 122 formed in the floor surface portion 10 of the vacuum transfer chamber 120. In addition, the bridging position corresponds to a position where a traveling surface is formed to cover the non-traveling region, which is the region where the gate valve 160 is provided, when the gate valve 160 is in the opened state.

In the wafer processing system 100 having the configuration described above, an example of an operation in which the wafer W is transferred using the first transfer module 20 and the wafer W is processed in the wafer processing chamber 110 will be described.

First, when the carrier C accommodating the wafer W to be processed is placed on the load port 141, the wafer W is taken out from the carrier C by the wafer transfer mechanism 142 inside the atmospheric transfer chamber 140. Subsequently, the wafer W is transferred to the alignment chamber 150 where alignment is performed on the wafer W. When the wafer W is taken out from the alignment chamber 150 by the wafer transfer mechanism 142, the gate valve 133 of the load-lock chamber 130 on either the left or right side when viewed from the front side of the wafer processing system 100 is opened.

Subsequently, the wafer transfer mechanism 142 enters either the left or right load-lock chamber 130, and the lifting pins 131 push up and receive the wafer W. Thereafter, when the wafer transfer mechanism 142 retracts from the load-lock chamber 130, the gate valve 133 is closed. In addition, the interior of the load-lock chamber 130 is switched from the atmospheric pressure atmosphere to the vacuum atmosphere.

When the interior of the load-lock chamber 130 becomes a vacuum atmosphere, the gate valve 132 on the vacuum transfer chamber 120 side is opened. At this time, inside the vacuum transfer chamber 120, the first transfer module 20 stands by on the bridging module 5 disposed at a position facing the load-lock chamber 130. Then, by the same operation as the bridging module 5 on the wafer processing chamber 110 side, which will be described later, the bridging module 5 is used to cause the first transfer module 20 to enter the load-lock chamber 130.

Then, the first transfer module 20 is moved inside the load-lock chamber 130 by magnetic floating using the repulsive force acting between the first transfer module 20 and the floor surface portion 10 of the load-lock chamber 130. Subsequently, the first transfer module 20 is positioned below the wafer W supported by the lifting pins 131, and the lifting pins 131 are lowered to deliver the wafer W to the first transfer module 20.

Thereafter, the first transfer module 20 holding the wafer W retracts from the load-lock chamber 130 using the bridging module 5 in the order opposite to the order of entry.

The first transfer module 20 that has returned to the vacuum transfer chamber 120 moves into the vacuum transfer chamber 120 by magnetic floating using the repulsive force acting between the first transfer module 20 and the floor surface portion 10. Then, among the four wafer processing chambers 110 at the front stage side and the middle stage side, the first transfer module 20 moves toward the wafer processing chamber 110 in which the wafer W to be transferred is processed.

As illustrated in FIG. 4, the bridging module 5 stands by at the accommodation position at a position facing the wafer processing chamber 110 of the transfer destination. For example, the top surface of the floor surface portion 10 inside the vacuum transfer chamber 120 and the top surface of the bridging module 5 at the accommodation position are substantially flush with each other, and thus an integral traveling surface is formed in the region where the traveling surface-side coils 15 and 53 are disposed. Therefore, the first transfer module 20 is movable from the floor surface portion 10 side of the vacuum transfer chamber 120 onto the bridging module 5 while maintaining the magnetic floating state. At this time, as illustrated in FIG. 4, the magnetic floating state may be temporarily released, and the first transfer module 20 may be placed on the bridging module 5.

Subsequently, the valve body 161 of the gate valve 160 is moved, and the loading/unloading port 163 is opened. Thereafter, the bridging module 5 is moved from the accommodation position to the bridging position by magnetic floating using the repulsive force acting between the bridging module 5 and the bottom surface portion 123 of the accommodation region 122. The bridging module 5 that has moved to the bridging position is disposed such that the protruded portion of the tip end of the bridging plate 51 is inserted into the loading/unloading port 163. As a result, the bridging module 5 is in a state of covering the non-traveling region, which is a region that is provided with the gate valve 160.

After the bridging module 5 has moved to the bridging position, the first transfer module 20 moves from the traveling surface of the bridging module 5 to the traveling surface of the floor surface portion 10 inside the wafer processing chamber 110 by magnetic floating. The first transfer module 20 that has entered the wafer processing chamber 110 moves to the region where the lifting pins 112 are disposed. Then, the lifting pins 112 are raised so that the wafer W held by the first transfer module 20 is pushed up from below and received by the lifting pins 112.

The first transfer module 20 that has delivered the wafer W moves to the bridging module 5 that is standing by at the bridging position, and retracts from the wafer processing chamber 110 through a route opposite to the route at the time of entry. After the first transfer module 20 has retracted, the lifting pins 112 are lowered downward to deliver the wafer W to the stage 111.

The operation of the bridging module 5 described above serves as a transfer assisting mechanism that assists the transfer of the wafer W between the vacuum transfer chamber 120 and the processing position via the non-traveling region.

When the first transfer module 20 retracts from the wafer processing chamber 110, the valve body 161 closes the loading/unloading port 163 communicating with the opening 121 of the vacuum transfer chamber 120 (closing the opening 121).

Meanwhile, the wafer W placed on the stage 111 is heated by a heater, a processing gas is supplied from the processing gas supplier. Further, the processing gas is plasmarized as needed to perform a predetermined processing.

After the processing of the wafer W is performed for a preset period in this way, the heating of the wafer W is stopped, and the supply of the processing gas is stopped. In addition, cooling of the wafer W may be performed by supplying a cooling gas into the wafer processing chamber 110 as needed. Thereafter, the first transfer module 20 is caused to enter the wafer processing chamber 110 in a procedure opposite to the procedure at the time of loading, and the wafer W is returned from the wafer processing chamber 110 to the load-lock chamber 130 via the vacuum transfer chamber 120.

In addition, after the internal atmosphere of the load-lock chamber 130 has switched to a normal pressure atmosphere, the wafer W inside the load-lock chamber 130 is taken out by the wafer transfer mechanism 142 at the side of the atmospheric transfer chamber 140 and returned to the predetermined carrier C.

According to the embodiment described above, when the wafer W is transferred using the first transfer module 20, the transfer of the wafer W passing through the non-traveling region can be assisted using the bridging module 5.

Here, the method of moving the bridging module 5 between the accommodation position and the bridging position is not limited to the case of using the magnetic floating. For example, a mechanical moving mechanism for moving the bridging module 5 may be provided in the vacuum transfer chamber 120, and the position of the bridging module 5 may be moved using the moving mechanism.

Next, for the wafer W transferred by the second transfer module 30 illustrated in FIG. 1, an example in which a wafer delivery part 4 inside the vacuum transfer channel 120 and a processing chamber-inside substrate transfer part inside the wafer processing chamber 110 are used to assist the transfer of the wafer passing through the non-traveling region will be described.

Figure 6:
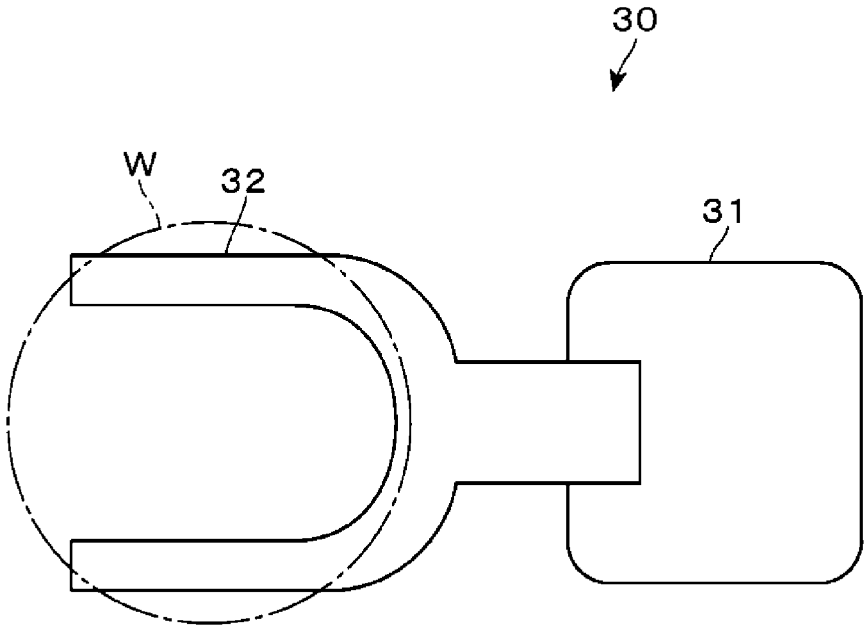
FIG. 6 is a plan view of a second transfer module.
Figure 7:
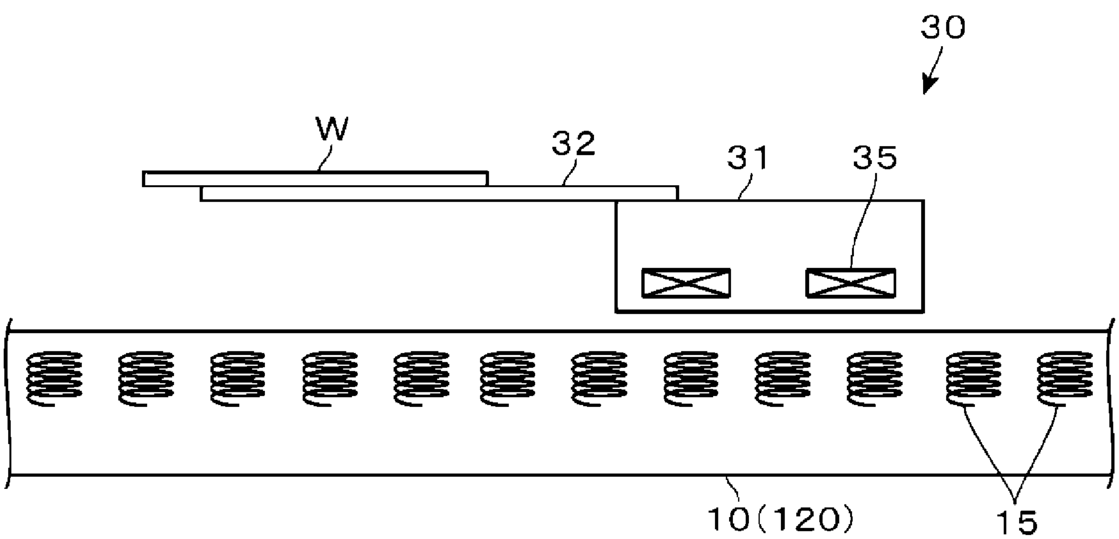
FIG. 7 is a vertical cross-sectional side view of the second transfer module and a floor surface portion.

As illustrated in FIGS. 1, 6, and 7, the second transfer module 30 includes a square plate-shaped floating body portion 31 having substantially the same width dimension as that of the first transfer module 20. The floating body portion 31 is provided with an arm 32 that extends laterally and holds the wafer W horizontally. At a tip end portion of the arm 32, a fork that is capable of being disposed to surround a region provided with three lifting pins 41 (or 131) from the left and right is provided. The fork corresponds to the substrate holder in the second transfer module 30.

Here, even when the above-described non-traveling region exists between the wafer processing chamber 110 and the second transfer module 30, by using the arm 32 having a sufficient length, it is possible to transmit the wafer W to the processing position by inserting the arm 32 into the wafer processing chamber 110. However, the longer the arm 32 is, the more difficult it is to change the direction of the second transfer module 30 in a narrow surface. Thus, there is a risk that the vacuum transfer chamber 120 will have to be increased in size.

Meanwhile, by using the second transfer module 30 provided with the arm 32, the floating body portion 31 provided with the module-side magnets 35 and the wafer W held by the arm 32 can be separated from each other. As a result, the magnetic influence of the module-side magnets 35 on the wafer W can be reduced. From this point of view, there is an advantage in using the second transfer module 30 provided with the arm 32.

Therefore, the wafer processing system 100 of the present example has a configuration in which the arm 32 is not inserted into the wafer processing chamber 110, and the wafer W is delivered between the wafer delivery part 4 disposed in the vacuum transfer chamber 120 and the processing chamber-inside substrate transfer part provided inside the wafer processing chamber 110.

Figure 8A:
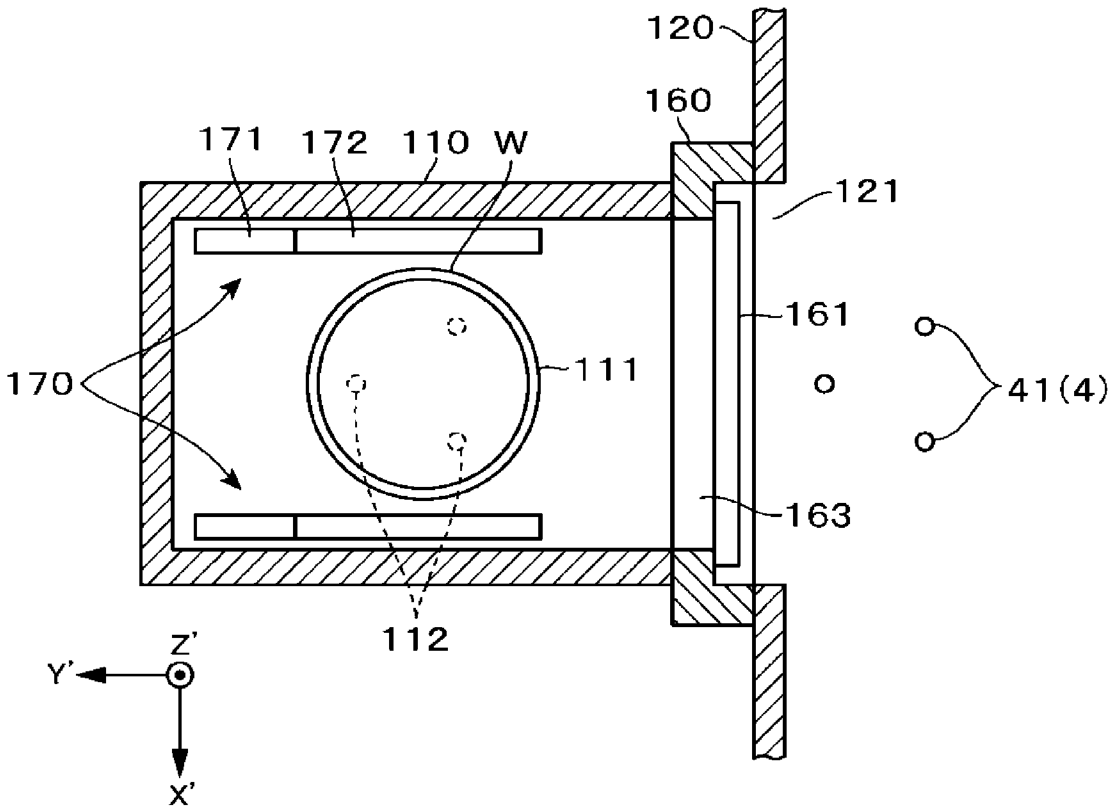
FIG. 8A is a first operation view of a wafer support module.
Figure 8B:
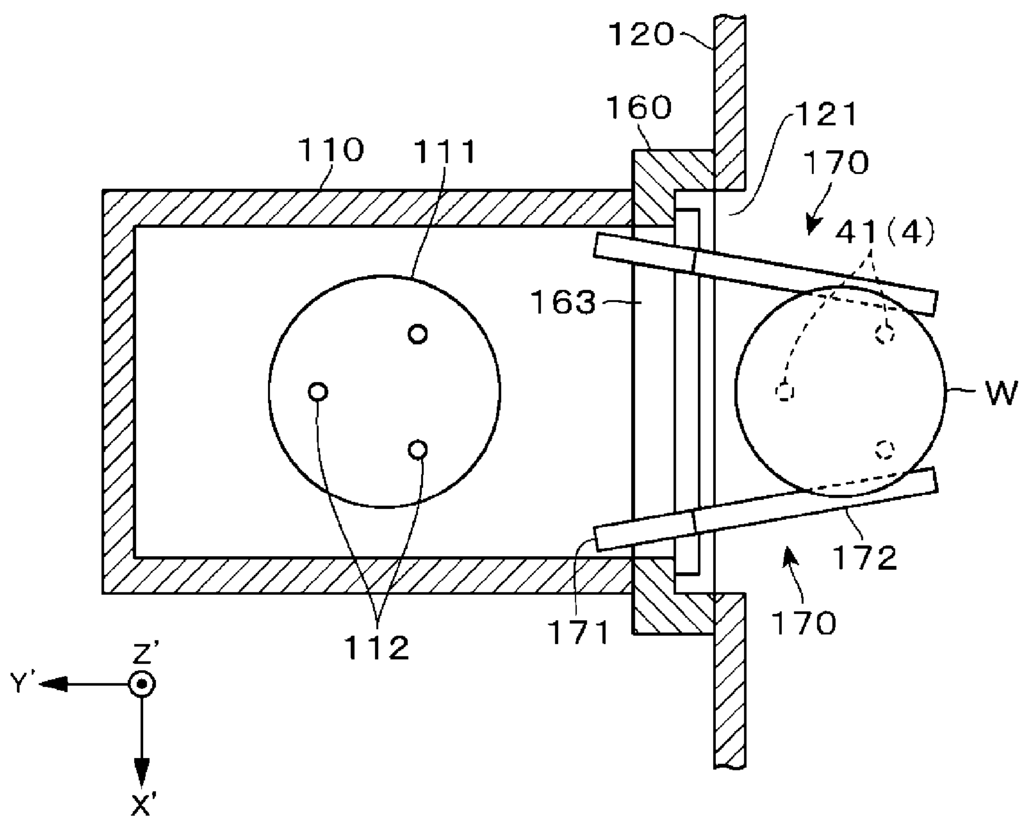
FIG. 8B is a second operation view of the wafer support module.
Figure 9A:
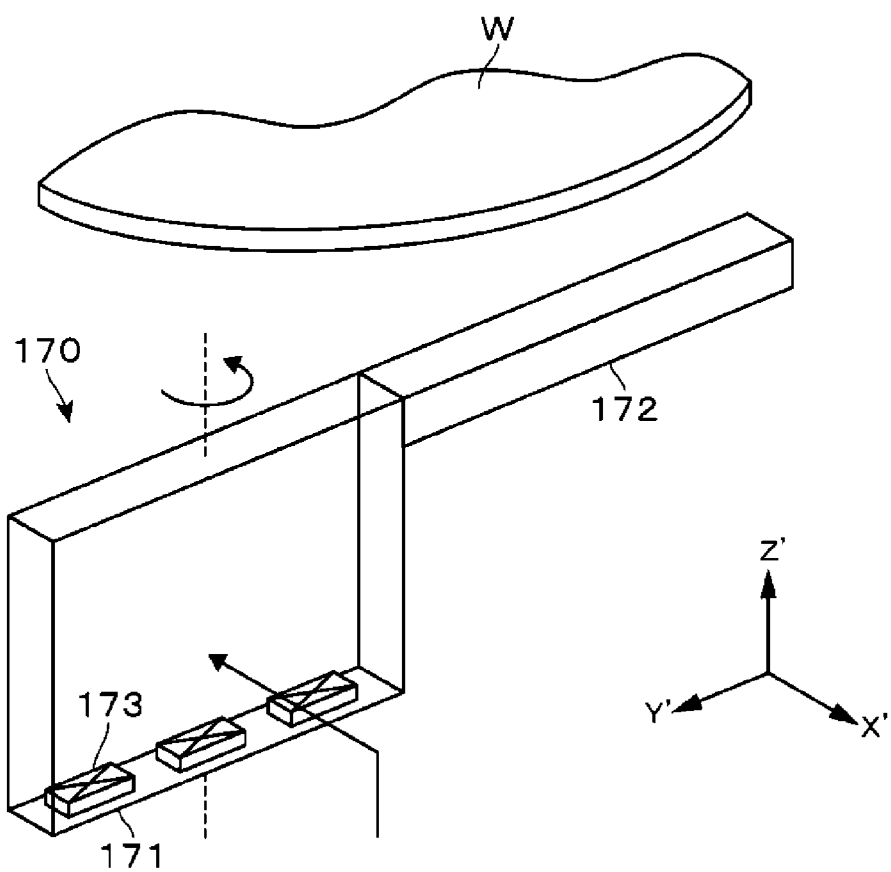
FIG. 9A is a third operation view of the wafer support module.
Figure 9B:
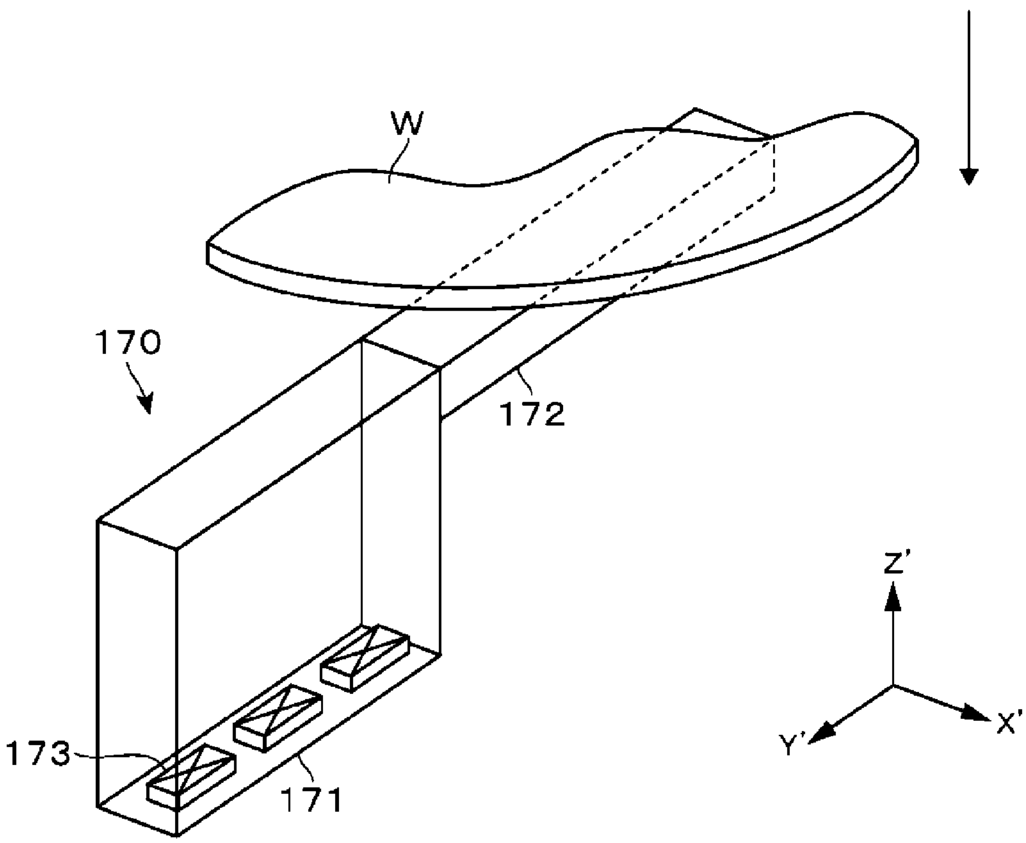
FIG. 9B is a fourth operation view of the wafer support module.
Figure 10A:
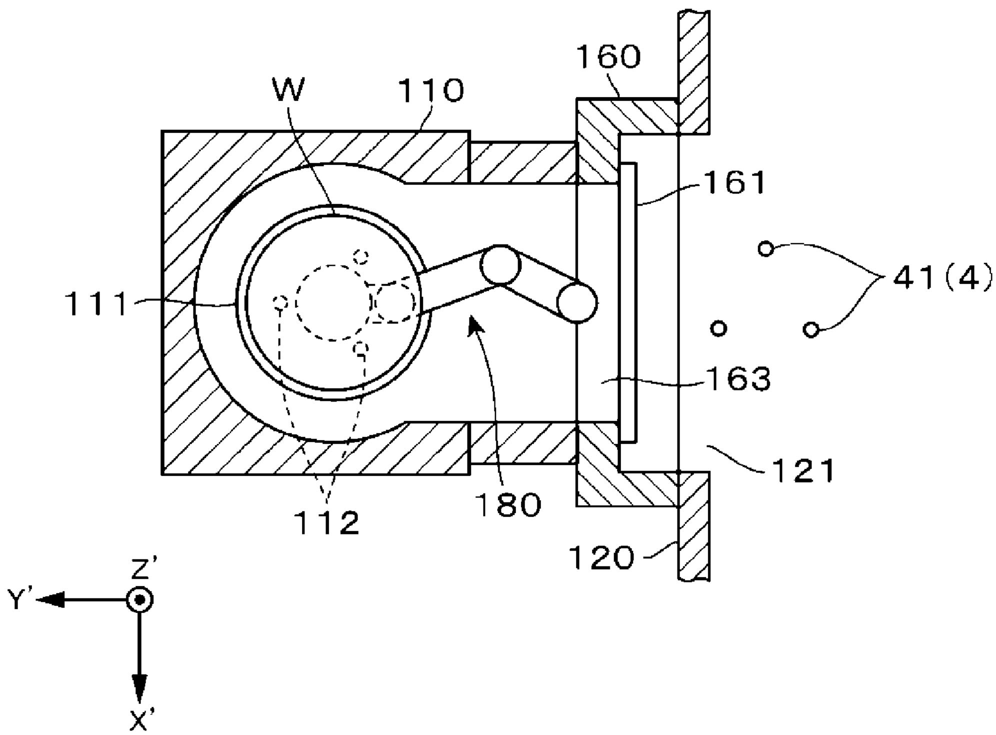
FIG. 10A is a first operation view of a processing chamber-inside extendible arm.
Figure 10B:
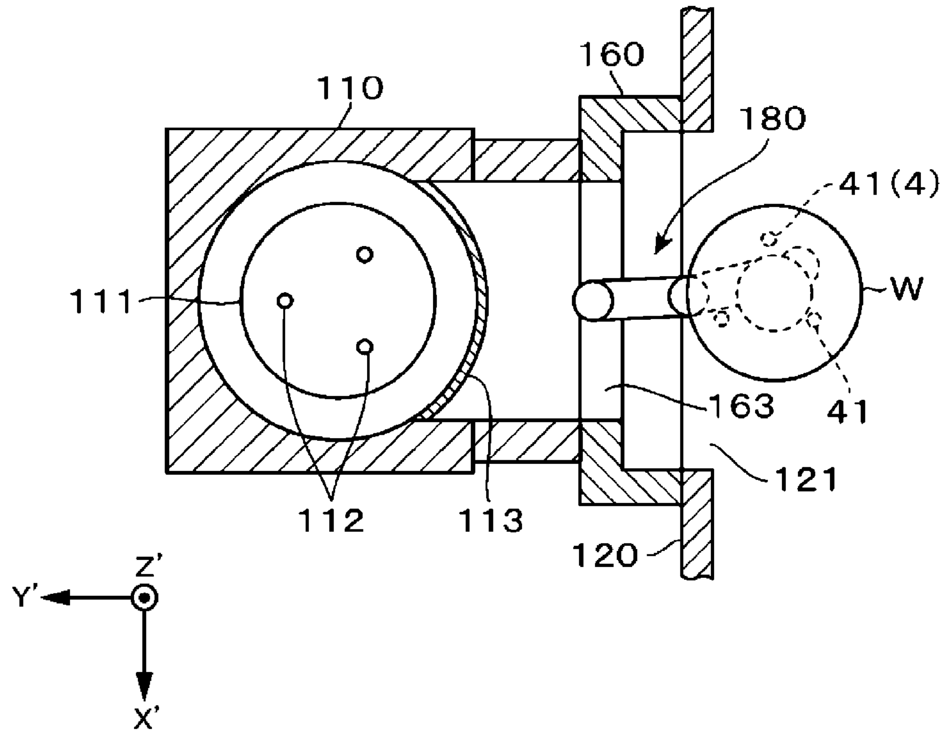
FIG. 10B is a second operation view of the processing chamber-inside extendible arm.
Figure 10C:
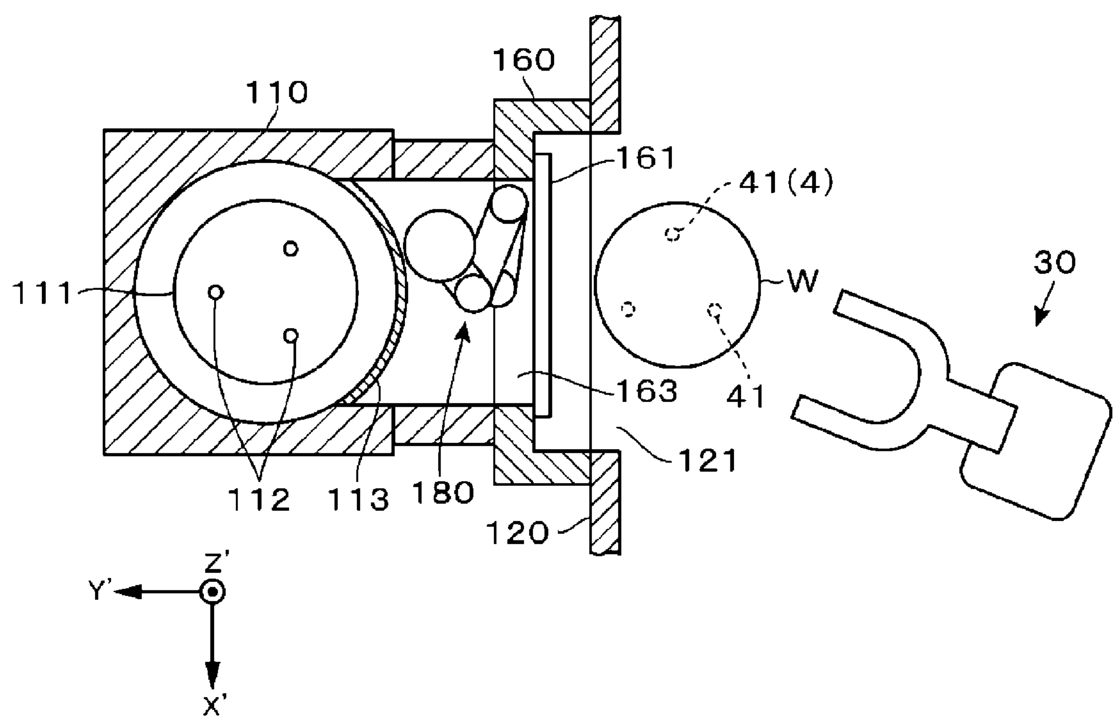
FIG. 10C is a third operation view of the processing chamber-inside extendible arm.

As examples of the configuration of the processing chamber-inside substrate transfer part, two examples of a case in which a wafer support module 170 described with reference to FIGS. 8A to 9B is used and a case in which a processing chamber-inside extendible arm 180 described with reference to FIGS. 10A to 10C is used will be described.

The wafer delivery part 4 is provided at a position facing the opening 121 of the vacuum transfer chamber 120, that is, a position facing the wafer processing chamber 110 connected to the vacuum transfer chamber 120. As described above, in the wafer processing system 100 illustrated in FIG. 1, the transfer of the wafer W using the second transfer module 30 is performed with respect to the two wafer processing chambers 110 in the rear stage. Therefore, the wafer delivery part 4 is also provided at a position facing these two wafer processing chambers 110. When the delivery of the wafer W is performed between the wafer delivery part 4 and the second transfer module 30, the wafer delivery part 4 corresponds to a substrate delivery part that holds the delivered wafer W.

The wafer delivery part 4 of the present example is provided with three lifting pins 41 to form a triangular support surface when viewed in a plan view. The lifting pins 41 are configured to move upward and downward from the floor surface portion 10 of the vacuum transfer chamber 120 by a lifting mechanism (not illustrated) to push up and hold the wafer W from below. In FIG. 1, a region in which the wafer W supported by the lifting pins 41 is projected onto the bottom surface of the vacuum transfer chamber 120 is indicated by a broken line as the wafer delivery part 4.

Further, a processing chamber-inside substrate transfer part configured to perform the transfer of the wafer W between the processing position in which the wafer W is processed and the wafer delivery part 4 is provided inside the wafer processing chamber 110.

FIGS. 8A to 9B illustrate an example in which a wafer support module 170, which is one configuration example of the processing chamber-inside substrate transfer part, is provided. Although not illustrated in these drawings, a plurality of traveling surface-side coils 15 are arranged on the floor surface portion 10 of the wafer processing chamber 110, for example, as in the floor surface portion of the wafer processing chamber 110 illustrated in FIG. 4.

The wafer support module 170 is capable of performing the transfer of the wafer W by magnetic floating using a repulsive force acting between the wafer support module 170 and the traveling surface-side coils 15 provided in the floor surface portion 10 of the wafer processing chamber 110. From this point of view, the traveling surface-side coils 15 provided in the floor surface portion 10 of the wafer processing chamber 110 correspond to traveling surface-side magnets for forming the traveling surface for the wafer support module 170.

Meanwhile, as illustrated in FIGS. 8A and 9A, two wafer support modules 170 are disposed inside the wafer processing chamber 110. Each wafer support module 170 includes a square plate-shaped floating body portion 171 disposed in a state in which a plate surface thereof is oriented in the vertical direction and a square rod-shaped support portion 172 provided to extend from an upper end portion of a plate thickness surface of the floating body portion 171 in the horizontal direction. A plurality of module-side magnets 173 configured with, for example, permanent magnets, are arranged inside the floating body portion 171 (FIGS. 9A and 9B). A repulsive force acts between the module-side magnets 173 and the magnetic fields generated by the traveling surface-side coils 15. By this action, the wafer support module 170 can be magnetically floated on the traveling surface set in the region where the traveling surface-side coils 15 are provided in the floor surface portion 10 of the wafer processing chamber 110. The module-side magnets 173 correspond to floating body-side magnets for the wafer support module 170.

As illustrated in FIG. 8A, the two wafer support modules 170 are disposed such that the stage 111 is interposed between the two wafer support modules 170 when viewed in a plan view. In addition, each floating body portion 171 is disposed such that the tip end portion of the support portion 172 is directed toward the gate valve 160, that is, the opening 121 of the vacuum transfer chamber 120.

According to the wafer support module 170 having the above-described configuration, the two wafer support modules 170 moving by magnetic floating are capable of cooperating with each other to support the wafer W common to respective support portions 172 thereof. These two wafer support modules 170 correspond to a processing chamber-inside substrate transfer part of the present embodiment.

The operation of transferring the wafer W between the wafer support module 170 having the above-described configuration and the wafer delivery part 4 will be described. FIGS. 8A and 8B illustrate an example of an operation of unloading the wafer W processed inside the wafer processing chamber 110.

In FIG. 8A, the wafer support modules 170 stand by inside the wafer processing chamber 110 during the processing of the wafer W. At this time, in order to avoid the influence of processing gas, plasma, or the like, a shutter may be used to partition a standby area of the wafer support modules 170 and a space for processing the wafer W.

When the processing of the wafer W to be transferred is completed, the wafer W is pushed up and raised by the lifting pins 112. Thereafter, each wafer support module 170 is magnetically floated, and the support portion 172 is moved below the wafer W. At this time, as illustrated in FIG. 9A, the wafer support module 170 is floated and moved to the vicinity of the wafer W, and then the wafer support module 170 is rotated around the vertical axis thereof. After the support portion 172 enters below the wafer W in this way, the wafer W is delivered from the lifting pins 112 to the wafer support module 170 by lowering the wafer W (FIG. 9B). In addition, by applying a rotational operation around the vertical axis of the wafer support module 170, the two wafer support modules 170 hold the wafer W in a state of diagonally facing each other when viewed in a plan view.

Subsequently, when the gate valve 160 is opened, the wafer support modules 170 holding the wafer W move toward the vacuum transfer chamber 120. Then, as illustrated in FIG. 8B, the support portion 172 holding the wafer W passes through the non-traveling region provided with the gate valve 160 while the floating body portion 171 is positioned inside the wafer processing chamber 110. As a result, the transfer of the wafer W to the wafer delivery part 4 can be performed by causing the support portions 172 to protrude from the opening 121 of the vacuum transfer chamber 120.

In addition, the loading of the wafer W into the wafer processing chamber 110 is performed in a procedure opposite to the procedure of the above operation.

Next, a case in which a processing chamber-inside extendible arm 180, which is another configuration example of the processing chamber-inside substrate transfer part, is used will be described with reference to FIGS. 10A to 10C.

The processing chamber-inside extendible arm 180 is configured as an articulated arm that can be extended/contracted in the state of holding the wafer W. The processing chamber-inside extendible arm 180 is disposed inside the wafer processing chamber 110, and is disposed in a region between the stage 111, which becomes the processing position of the wafer W, and the gate valve 160. Here, a shutter 113 may be provided in order to avoid the influence of the processing gas, plasma, or the like supplied to the wafer processing chamber 110 during the period of processing the wafer W (FIGS. 10B and 10C). The shutter 113 serves to partition the space in which the wafer W is processed and the space in which the shutter 113 is disposed during the period of processing the wafer W disposed at the processing position.

An operation of transferring the wafer W between the processing chamber-inside extendible arm 180 and the wafer delivery part 4 will be described. FIGS. 10A to 10C illustrating an example of an operation of unloading the wafer W which has been processed inside the wafer processing chamber 110.

When the processing of the wafer W to be transferred is completed, the wafer W is pushed up and raised by the lifting pins 112. Thereafter, the processing chamber-inside extendible arm 180 is extended toward the stage 111 such that a wafer holder provided at the tip end of the processing chamber-inside extendible arm 180 enters below the wafer W. Thereafter, by lowering the wafer W, the wafer W is delivered from the lifting pins 112 to the processing chamber-inside extendible arm 180 (FIG. 10A).

Subsequently, when the gate valve 160 is opened, the processing chamber-inside extendible arm 180 holding the wafer W retracts and then reverses the extending direction thereof. Then, as illustrated in FIG. 10B, the processing chamber-inside extendible arm 180 passes through the non-traveling region while holding the wafer W so that the transfer of the wafer W to the wafer delivery part 4 is performed. After the wafer W is delivered to the wafer delivery part 4, the processing chamber-inside extendible arm 180 moves into the wafer processing chamber 110. Thereafter, the second transfer module 30 receives the wafer W from the wafer delivery part 4 and performs the transfer of the wafer W inside the vacuum transfer chamber 120.

In addition, the loading of the wafer W into the wafer processing chamber 110 is performed a procedure opposite to the procedure of the above-described operation.

In the wafer processing system 100 illustrated in FIG. 1, the wafer delivery part 4 having the above-described configuration and the wafer support module 170 or the processing chamber-inside extendible arm 180 are also provided for the load lock chamber 130 disposed in the center when viewed from the front side.

In FIG. 1, the illustration of the wafer support modules 170 and the processing chamber-inside extendible arm 180 in the wafer processing chambers 110 on the rear stage side and the central load-lock chamber 130 is omitted.

In the wafer processing system 100 having the configuration described above, an example of an operation of transferring the wafer W using the second transfer module 30 and processing the wafer W inside the wafer processing chamber 110 will be described.

The wafer W to be processed is loaded into the central load-lock chamber 130 when viewed from the front side in the same procedure as in the case of transferring the wafer W using the first transfer module 20 described above. When the interior of the load-lock chamber 130 becomes a vacuum atmosphere, the gate valve 132 on the vacuum transfer chamber 120 side is opened. Then, the wafer W is delivered to the wafer delivery part 4 disposed on the vacuum transfer chamber 120 side using the wafer support module 170 provided inside the load-lock chamber 130 or the processing chamber-inside extendible arm 180.

The wafer W held by the wafer delivery part 4 is delivered to the arm 32 of the second transfer module 30 that moves by magnetic floating, and moves to the wafer processing chamber 110 in which the processing of the respective wafer W is performed, of the two wafer processing chambers 110 on the rear stage side.

The wafer delivery part 4 is provided on the front side of the wafer processing chamber 110 as the transfer destination. After moving the second transfer module 30 to the wafer delivery part 4, the lifting pins 41, which have been lowered to the floor surface side, are raised. By this operation, the wafer W is delivered from the arm 32 to the lifting pins 41.

At this time, as illustrated in FIG. 10C, the movement path of the second transfer module 30 may be set such that the second transfer module 30 enters or retracts from the arrangement region of the lifting pins 41 while diagonally facing the wafer processing chamber 110. By setting the movement path in this way, the movement path of the second transfer module 30 becomes compact compared with a case in which the movement path is set such that the second transfer module 30 enters or retracts from a direction facing the wafer processing chamber 110. This makes it possible to suppress an increase in size of the vacuum transfer chamber 120.

Subsequently, the gate valve 160 is opened, and by the operation described above, the wafer W held by the lifting pins 41 is received using the wafer support module 170 inside the wafer processing chamber 110 or the processing chamber-inside extendible arm 180 and is transferred to the stage 111. Then, the lifting pins 112 is raised toward the stage 111 to receive the wafer W. Thereafter, the wafer support module 170 or the processing chamber-inside extendible arm 180 is retracted, and the wafer W is lowered and placed at the processing position. When the wafer W is placed at the processing position, the gate valve 160 is closed (the opening 121 is closed), and the wafer W is processed according to a predetermined procedure. After processing the wafer W, the wafer W is unloaded in a procedure opposite to that at the time of loading.

The wafer delivery part 4 and the wafer support module 170 or the processing chamber-inside extendible arm 180 described above play a role of a transfer assisting mechanism that assists the transfer of the wafer W between the vacuum transfer chamber 120 and the processing position via the non-traveling region.

According to the above-described embodiments, when the wafer W is transferred using the second transfer module 30, by using the wafer delivery part 4, the wafer support module 170, and the processing chamber-inside extendible arm 180, it is possible to assist the transfer of the wafer W passing through the non-traveling region.

For the sake of convenience in description, the example in which the first transfer module 20 and the second transfer module 30 having different configurations are disposed in the common vacuum transfer chamber 120 has been described with reference to FIG. 1. The present disclosure is not limited to this example. One of the first transfer module 20 and the second transfer module 30 may be disposed in the vacuum transfer chamber 120 to transfer the wafer W.

In the embodiment described with reference to FIGS. 6 to 10C, from the viewpoint of describing the influence of the length of the arm 32, an example in which the second transfer module 30, the wafer delivery part 4, and the processing chamber-inside substrate transfer part (the wafer support module 170 and the processing chamber-inside extendible arm 180) are used in combination has been described.

Meanwhile, for example, the second transfer module 30 including the arm 32 may be used, and the wafer W may be transferred by the second transfer module 30 using the bridging module 5 which is a transfer assist mechanism. At this time, it is not an essential requirement to cause the second transfer module 30 to enter the wafer processing chamber 110. For example, on the bridging module 5 moved to the bridging position, only the arm 32 may be inserted into the wafer processing chamber 110 to deliver the wafer W.

In addition, the wafer W may also be transferred using the square plate-shaped first transfer module 20 and using the wafer delivery part 4 which is a transfer assist mechanism and the processing chamber-inside substrate transfer part (the wafer support module 170 and the processing chamber-inside extendible arm 180).

Subsequently, in a wafer processing system **100*a* illustrated in FIG. 11, a vacuum transfer chamber 120*a* is configured to have a pentagon or more polygon shape (a dodecagon in the example of FIG. 11) when viewed in a plan view. The wafer processing system 100*a* has a configuration in which a wafer processing chamber 110 is connected to each of a plurality of sidewall surfaces (seven sidewall surfaces in the example of FIG. 11) of the vacuum transfer chamber 120*a*. In the wafer processing system 100*a* having such a configuration, conventionally, there was a case in which an extendible articulated arm is disposed in the central portion of the vacuum transfer chamber 120***a*, and the articulated arm is used to perform loading/unloading of the wafer W with respect to each wafer processing chamber 110.

However, when a large number of wafer processing chambers 110 are connected to the common vacuum transfer chamber 120*a*, the space for disposing these wafer processing chambers 110 increases. Therefore, the distance from the center of the polygonal vacuum transfer chamber 120*a* to the wafer processing chambers 110 may increase. Meanwhile, there is a limit to the distance in which the wafer W can be transferred by the extension/contraction of the articulated arm. Therefore, there was a case in which it is difficult to connect many wafer processing chambers 110 to the vacuum transfer chamber 120*a*.

Figure 11:
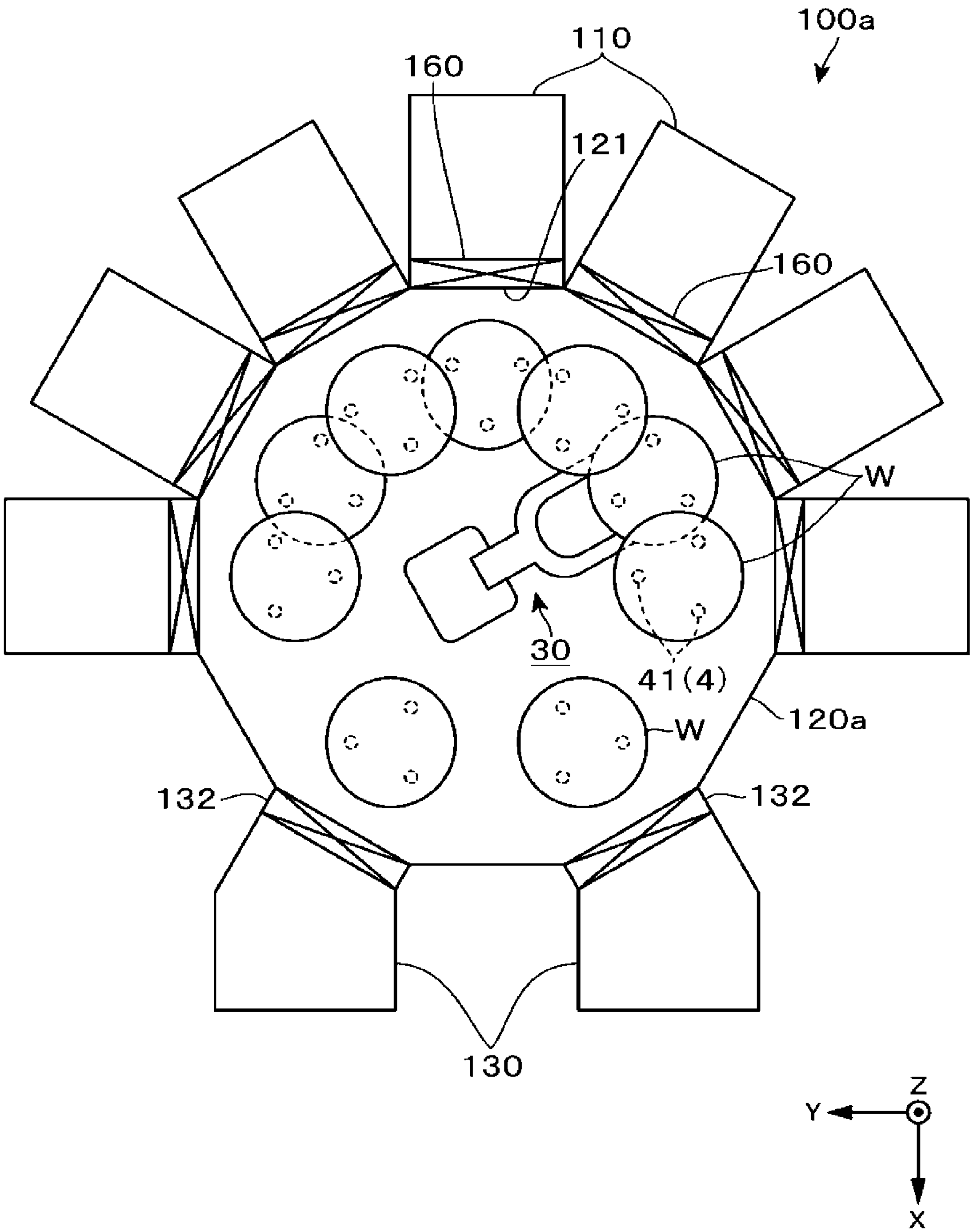
FIG. 11 is a plan view of a wafer processing system according to a second embodiment.

In this regard, in the wafer processing system 100*a* illustrated in FIG. 11, the wafer W is transferred using the second transfer module 30, the wafer delivery part 4, and the processing chamber-inside substrate transfer part (the wafer support module 170 or the processing chamber-inside extendible arm 180 (not illustrated in FIG. 11)). By using the second transfer module 30, the wafer W can be transferred without being restricted by the extension/contraction range of the articulated arm.

In addition, in the wafer processing system 100*a* illustrated in FIG. 11, the plurality of wafer processing chambers 110 are connected side by side to the vacuum transfer chamber 120*a* to be adjacent to each other. A plurality of wafer delivery parts 4 are provided respectively at positions that respectively face the openings 121 to which the wafer processing chambers 110 are connected. As described above, each of the wafer delivery parts 4 is configured to hold the wafer W delivered from the second transfer module 30 while supporting the lower surface of the wafer W from below.

Figure 12:
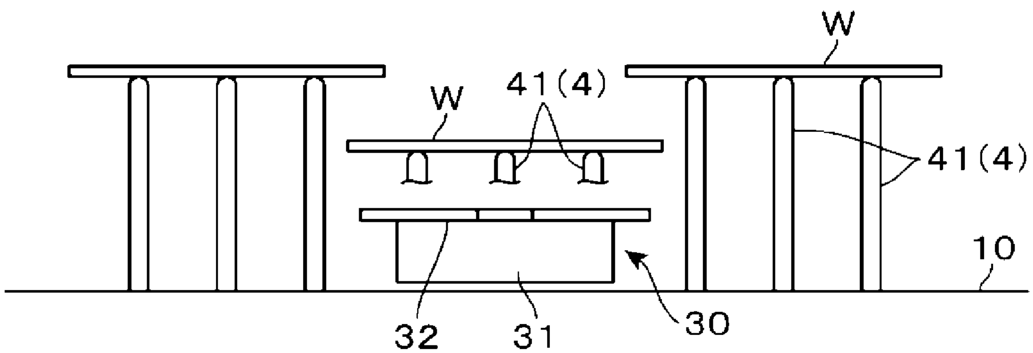
FIG. 12 is a side view illustrating a state in which wafers are held on a plurality of wafer delivery parts.

At this time, when the intervals between the wafer delivery parts 4 disposed adjacent to each other are narrow, the wafers W may overlap and interfere with each other as illustrated in FIG. 11. Therefore, as illustrated in FIG. 12, in the wafer processing system 100*a* of the present example, when the wafer delivery parts 4 disposed adjacent to each other support the wafers W, respectively, the height positions for supporting the wafers W are made different from each other. This makes it possible to avoid interference between the wafers W.

In the wafer processing system 100*a* illustrated in FIG. 11, the first transfer module 20 may be used to transfer the wafers W, or wafer processing chambers 110 for each of which a bridging module 5 is used to allow a transfer module 20 or 30 to enter the wafer processing chamber may be additionally provided.

Here, a configuration example of the floor surface portion 10*a* provided in the vacuum transfer chamber 120 will be described with reference to FIGS. 13 and 14.

Figure 13:
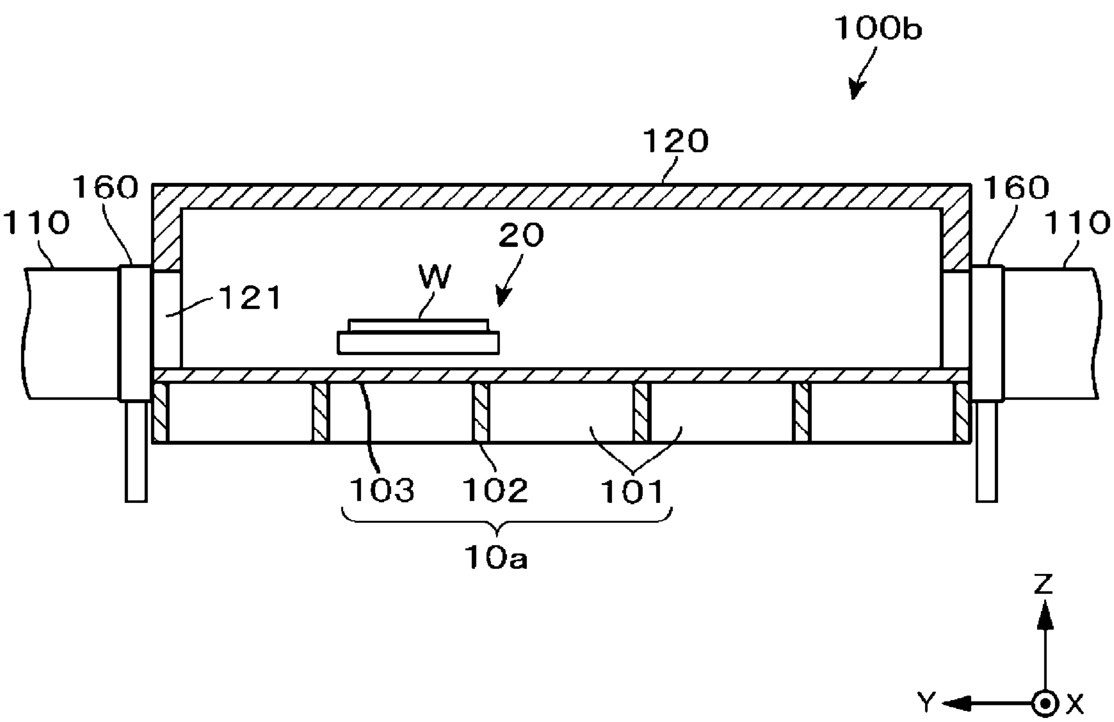
FIG. 13 is a vertical cross-sectional side view illustrating a configuration in which tiles for magnetic floating are provided outside a vacuum transfer chamber.

FIG. 13 illustrates an example in which the floor surface portion 10*a* is provided on an outer surface side of a housing constituting the vacuum transfer chamber 120. As illustrated in FIG. 14, the lower surface of the vacuum transfer chamber 120 is partitioned in a grid pattern by reinforcing ribs 102, and tiles 101 are disposed in each section. The traveling surface-side coils 15 shown in FIGS. 3 and 7 and the like are arranged in these tiles 101. As described above, these traveling surface-side coils 15 generate magnetic fields for magnetically floating the first transfer module 20 or the second transfer module 30 by being supplied with power from a power supply (not illustrated).

On the top surface of the tiles 101, a non-magnetic material plate 103 constituting the bottom surface of the housing constituting the vacuum transfer chamber 120 is disposed. By configuring the non-magnetic material plate 103 with a non-magnetic material such as aluminum, a magnetic field can be formed inside the vacuum transfer chamber 120 without being affected by the non-magnetic material plate 103. As a result, the traveling surface for the first transfer module 20 or the second transfer module 30 may be provided on the top surface of the non-magnetic material plate 103.

Figure 14:
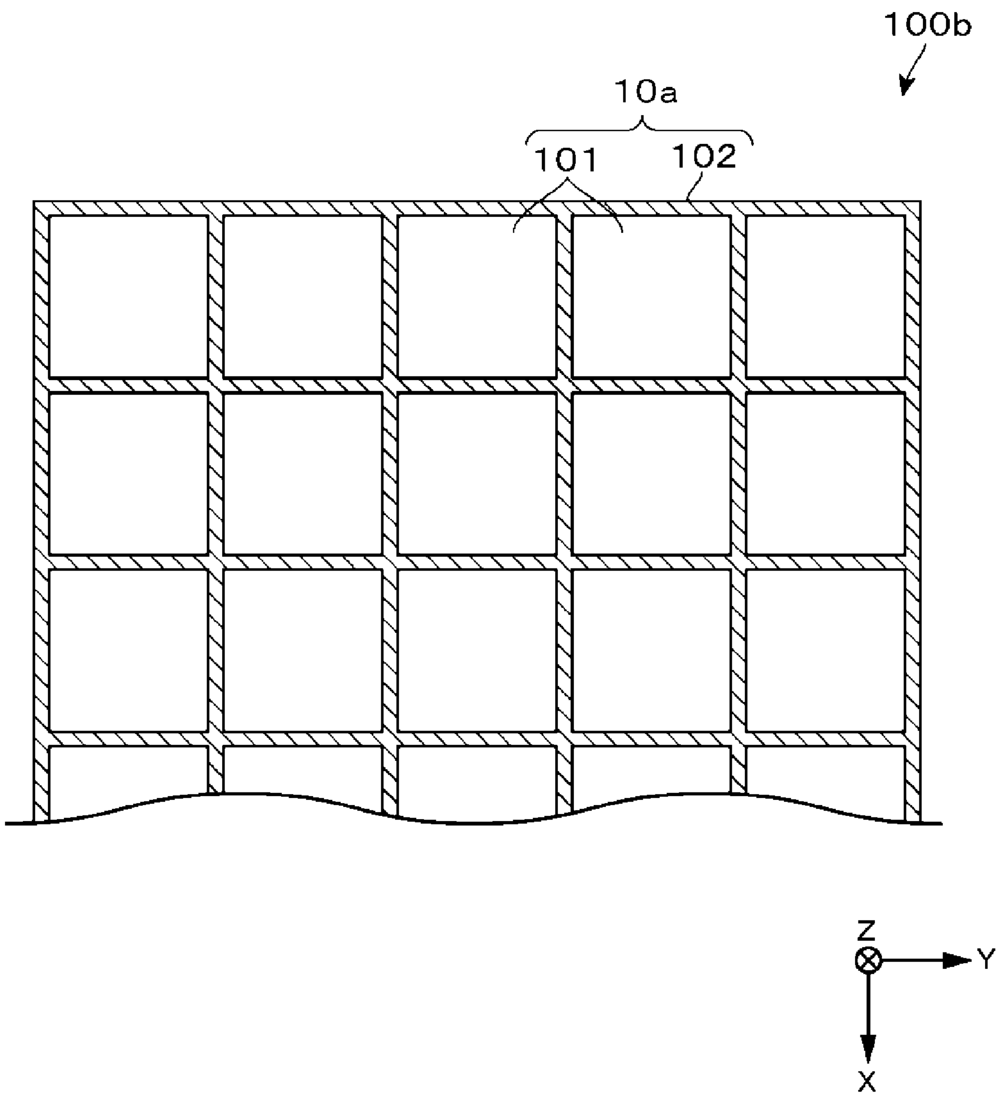
FIG. 14 is a view illustrating a layout of the tiles provided outside the vacuum transfer chamber.

According to the floor surface portion 10*a* having the configuration illustrated in FIGS. 13 and 14, the reinforcing ribs 102 having a grid pattern are provided for reinforcement. Therefore, even when the vacuum transfer chamber 120 is enlarged, it is possible to maintain the housing structure of the vacuum transfer chamber 120 against the force exerted by the vacuum atmosphere inside the vacuum transfer chamber without excessively increasing the thickness of the non-magnetic material plate 103.

From the viewpoint of improving the strength of the vacuum transfer chamber 120 only, the floor surface portion 10*a* formed by combining the reinforcing ribs 102 and the tiles 101 may be disposed inside the vacuum transfer chamber 120.

By disposing the tiles 101 on the atmospheric atmosphere side, it is easy to release heat generated when supplying current to the traveling surface-side coils 15 disposed inside the tiles 101. As a result, an increase in temperature of the tiles 101 is suppressed, and thus the efficiency of the magnetic force generated in the traveling surface-side coils 15 is suppressed from being reduced due to such a temperature increase. In addition, it is also possible to suppress the occurrence of deformation due to thermal expansion of respective constituent members (the tiles 101, the reinforcing ribs 102, and the non-magnetic material plate 103) of the floor surface portion 10 with the temperature increase of the tiles 101.

According to the present disclosure in some embodiments, in transferring a substrate using a magnetic floating-type substrate transfer module, it is possible to assist transferring the substrate through a non-traveling region in which the substrate transfer module cannot move.

The embodiments disclosed herein should be considered to be exemplary in all respects and not restrictive. The above-described embodiments may be omitted, replaced, or modified in various forms without departing from the scope and spirit of the appended claims.

What is claimed is:

1. An apparatus for transferring a substrate to at least one substrate processing chamber to process the substrate, comprising:

a substrate transfer chamber including a floor surface portion in which a traveling surface-side magnet is provided and a sidewall portion in which a plurality of openings for loading/unloading the substrate between the substrate transfer chamber and the at least one substrate processing chamber is formed;

a substrate transfer module including a substrate holder configured to hold the substrate and a floating body-side magnet that acts a repulsive force with the traveling surface-side magnet, the substrate transfer module being configured to be movable on a first traveling surface formed in a region provided with the traveling surface-side magnet by magnetic floating using the repulsive force;

the at least one substrate processing chamber connected to the substrate transfer chamber via a gate valve configured to open/close each of the plurality of openings and constituting a non-traveling region in which the substrate transfer module is not movable by the magnetic floating; and a transfer assist mechanism configured to assist the transfer of the substrate by the substrate transfer module between the substrate transfer chamber and a substrate processing position inside the at least one substrate processing chamber via the non-traveling region, wherein the transfer assist mechanism is a bridging module configured to be movable with the substrate transfer module placed on the bridging module between an accommodation position at which the transfer assist mechanism forms the first traveling surface provided with the traveling surface-side magnet and integrated with the floor surface portion in a state of being accommodated in the floor surface portion of the substrate transfer chamber, and a bridging position at which the transfer assist mechanism forms the first traveling surface to cover the non-traveling region when the gate valve is in an opened state.

2. The apparatus of claim 1, wherein the traveling surface-side magnet is provided in the floor surface portion of the at least one substrate processing chamber, and the substrate transfer module is configured to perform the transfer of the substrate between the substrate transfer chamber and the at least one substrate processing chamber by moving between the bridging module moved to the bridging position and an interior of the at least one substrate processing chamber.

3. The apparatus of claim 2, wherein an accommodation region in which the bridging module is accommodated is formed in the floor surface portion of the substrate transfer chamber, and a bottom surface portion of the accommodation region is provided with a traveling surface-side magnet for the bridging module to form a second traveling surface on which the bridging module moves between the accommodation position and the bridging position, and wherein the bridging module is provided with a floating body-side magnet for the bridging module configured to perform magnetic floating using the repulsive force acting between the bridging module and the traveling surface-side magnet for the bridging module.

4. The apparatus of claim 1, wherein an accommodation region in which the bridging module is accommodated is formed in the floor surface portion of the substrate transfer chamber, and a bottom surface portion of the accommodation region is provided with a traveling surface-side magnet for the bridging module to form a second traveling surface on which the bridging module moves between the accommodation position and the bridging position, and wherein the bridging module is provided with a floating body-side magnet for the bridging module configured to perform magnetic floating using the repulsive force acting between the bridging module and the traveling surface-side magnet for the bridging module.

5. The apparatus of claim 1, wherein the transfer assist mechanism includes:

at least one substrate delivery part configured to deliver the substrate to and from the substrate transfer module at a position facing each of the plurality of openings inside the substrate transfer chamber and hold the substrate delivered from the substrate transfer module; and a processing chamber-inside substrate transfer part provided inside the at least one substrate processing chamber and configured to transfer the substrate between the processing position and the at least one substrate delivery part.

6. The apparatus of claim 5, wherein the floor surface portion of the at least one substrate processing chamber is provided with a traveling surface-side magnet for the processing chamber-inside substrate transfer part to form a third traveling surface on which the processing chamber-inside substrate transfer part is moved, wherein the processing chamber-inside substrate transfer part is configured with a plurality of substrate support modules configured to perform magnetic floating using a repulsive force acting with the traveling surface-side magnet for the processing chamber-inside substrate transfer part, each of the plurality of substrate support modules including: a floating body portion provided with a floating body-side magnet for the processing chamber-inside substrate transfer part; and a support portion provided to extend in a horizontal direction toward each of the plurality of openings when viewed from the floating body portion and configured to support a lower surface of the substrate, and wherein the plurality of substrate support modules are configured to cooperate with each other in a state of supporting the substrate common to the support portions of the plurality of substrate support modules, pass through the non-traveling region in a state in which the floating body portions are positioned in the at least one substrate processing chamber, and execute the transfer of the substrate to the at least one substrate delivery part by causing the support portions to protrude from each of the plurality of openings.

7. The apparatus of claim 5, wherein the processing chamber-inside substrate transfer part includes a substrate transfer arm disposed in a region between the processing position of the substrate and the gate valve, and configured to be extendible while holding the substrate.

8. The apparatus of claim 7, wherein the at least one substrate processing chamber includes a shutter configured to partition a space in which the substrate is processed and a space in which the substrate transfer arm is disposed during a period of processing the substrate disposed at the processing position.

9. The apparatus of claim 8, wherein the at least one substrate processing chamber includes a plurality of substrate processing chambers connected side by side to the substrate transfer chamber to be adjacent to each other, and the at least one substrate delivery part includes a plurality of substrate delivery parts provided at positions facing the plurality of openings to which the plurality of substrate processing chambers are connected, each of the plurality of substrate delivery parts is configured to hold the substrate delivered from the substrate transfer module while supporting a lower surface of the substrate, and the plurality of substrate delivery parts are configured such that, when each of the plurality of substrate delivery parts disposed adjacent to each other supports the substrate, the substrates are arranged to overlap each other at intervals when viewed in a plan view, and height positions at which the substrates are supported are different from each other to avoid interference between the substrates.

10. The apparatus of claim 7, wherein the at least one substrate processing chamber includes a plurality of substrate processing chambers connected side by side to the substrate transfer chamber to be adjacent to each other, and the at least one substrate delivery part includes a plurality of substrate delivery parts provided at positions facing the plurality of openings to which the plurality of substrate processing chambers are connected, each of the plurality of substrate delivery parts is configured to hold the substrate delivered from the substrate transfer module while supporting a lower surface of the substrate, and the plurality of substrate delivery parts are configured such that, when each of the plurality of substrate delivery parts disposed adjacent to each other supports the substrate, the substrates are arranged to overlap each other at intervals when viewed in a plan view, and height positions at which the substrates are supported are different from each other to avoid interference between the substrates.

11. A method of transferring a substrate to a substrate processing chamber in which the substrate is processed, the method comprising:

transferring the substrate using a substrate transfer module in a substrate transfer chamber including a floor surface portion in which a traveling surface-side magnet is provided and a sidewall portion in which an opening for loading/unloading the substrate between the substrate transfer chamber and the substrate processing chamber is formed, wherein the substrate transfer module includes a substrate holder configured to hold the substrate and a floating body-side magnet that acts a repulsive force with the traveling surface-side magnet, and is configured to be movable on a traveling surface formed in a region provided with the traveling surface-side magnet by magnetic floating using the repulsive force; and assisting, by a transfer assist mechanism, the transferring the substrate between the substrate transfer chamber and a substrate processing position inside the substrate processing chamber via a non-traveling region when the substrate is transferred by the substrate transfer module to the substrate processing chamber connected to the substrate transfer chamber via a gate valve configured to open/close the opening and constituting the non-traveling region in which the substrate transfer module is not movable by the magnetic floating, wherein the transfer assist mechanism is a bridging module configured to be movable with the substrate transfer module placed on the bridging module between an accommodation position at which the transfer assist mechanism forms the traveling surface provided with the traveling surface-side magnet and integrated with the floor surface portion in a state of being accommodated in the floor surface portion of the substrate transfer chamber, and a bridging position at which the transfer assist mechanism forms the traveling surface to cover the non-traveling region when the gate valve is in an opened state.

* * * * *